United States Patent [19]

Von Sichart et al.

[11] Patent Number: 4,547,765

[45] Date of Patent: Oct. 15, 1985

[54] METHOD AND CIRCUIT ARRANGEMENT FOR TRANSLITERATION OF CODE WORDS

[75] Inventors: Frithjof Von Sichart, Munich; Klaus Wiedeburg, Puchheim, both of Fed. Rep. of Germany

[73] Assignee: Siemens Aktiengesellschaft, Berlin & Munich, Fed. Rep. of Germany

[21] Appl. No.: 527,988

[22] Filed: Aug. 31, 1983

[30] Foreign Application Priority Data

Sep. 1, 1982 [DE] Fed. Rep. of Germany ....... 3232548

[51] Int. Cl.$^4$ .............................................. H04L 3/00
[52] U.S. Cl. ............................................. 340/347 DD
[58] Field of Search ........ 340/347 DD, 347 P, 347 M

[56] References Cited

U.S. PATENT DOCUMENTS

| | | | |
|---|---|---|---|
| 3,796,830 | 3/1974 | Smith | 178/22 |
| 4,069,478 | 1/1978 | Miller | 340/347 DD |
| 4,115,768 | 9/1978 | Eggenberger et al. | 340/347 DD |
| 4,429,300 | 1/1984 | Yamasawa et al. | 340/347 DD |

FOREIGN PATENT DOCUMENTS 2621882 12/1976 Fed. Rep. of Germany .

Primary Examiner—Vit W. Miska
Attorney, Agent, or Firm—Hill, Van Santen, Steadman & Simpson

[57] ABSTRACT

For transliterating code words of a code having m-place code words into the corresponding code words of a different code likewise having m-place code words, individual bits of the code word to be translitereated are forwarded during serial input into a m-place shift register or during the serial output therefrom. These bits are forwarded non-negated or negated from register stage to register stage over a respective forwarding circuit depending upon the measure or criterion of coincidence or non-coincidence between the code word to be transliterated and the code words of the different code. This occurs in such manner that the traversing bits experience a respective negation in front of and after a register stage whose position within the shift register corresponds to the position of non-coinciding bits within the two code words.

5 Claims, 2 Drawing Figures

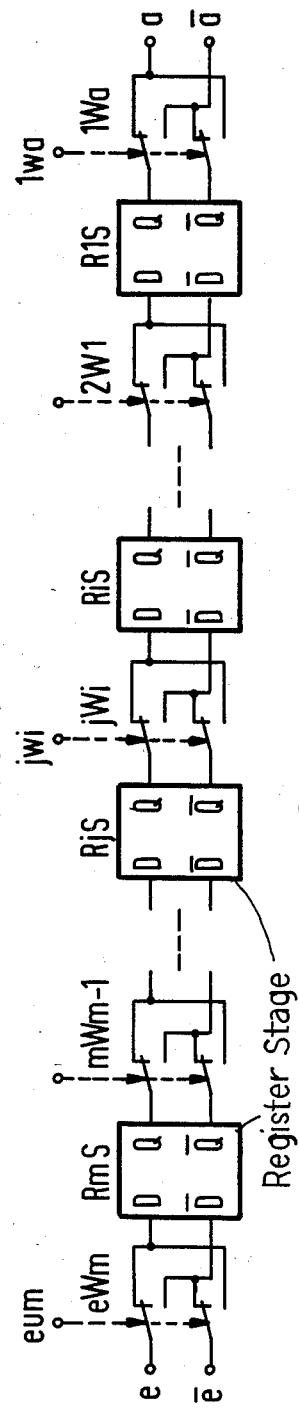
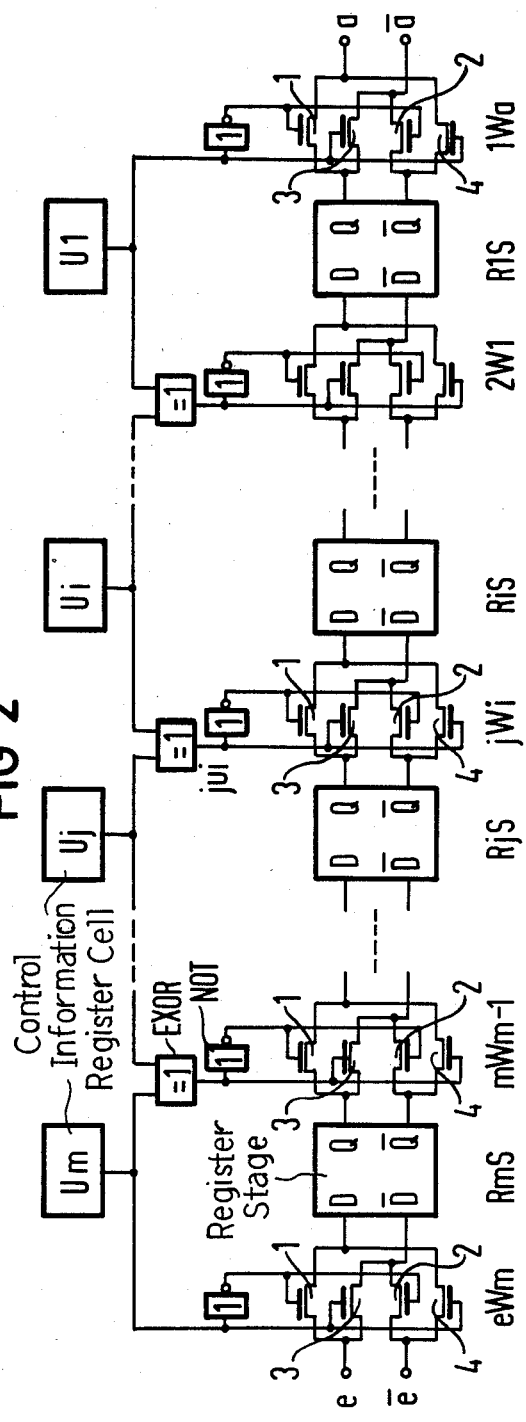

METHOD AND CIRCUIT ARRANGEMENT FOR TRANSLITERATION OF CODE WORDS

BACKGROUND OF THE INVENTION

The invention relates to a transliteration of code words of a code having m-place code words into the corresponding code words of a different code likewise having m-place code words.

For the purpose of forwarding or processing of information in digital communications technology and in data processing technology as well, such information is represented by a digital signal composed of sequences of so-called code words. The code words under given conditions can be obtained from an underlying analog signal by means of constantly repeated sampling, quantization, and coding. Such code words then correspond to the respective analog signal sampling value.

There are two CCITT recommendations for the relationship between the analog signal values of a telephone analog signal and the code words of a corresponding telephone digital signal. These usually are referred to as A-law and μ-law, and both respectively approximate a logarithmic quantization interval/analog signal value companding characteristic by means of a segment-wise, linear steep-drop characteristic curve. Although the steep-drop characteristic curve following the so-called A-law can be realized in a digital-to-analog converter in a particularly favorable manner in terms of circuit technology with the assistance of a so-called R-2R-network fed with a constant current, the μ characteristic, which is not as simple to realize, is nonetheless preferred in some countries. The consequence of this is that different coders/decoders must be provided for communication devices which are identical per se under given conditions but which are employed in different countries, this being accompanied by a reduction of the respectively required unit numbers not desired for large scale integration, or, on the other hand, that, proceeding from a uniform codec, an additional transliteration of the output or input bits must be effected by means of an arithmetic unit.

SUMMARY OF THE INVENTION

An object of the invention is to avoid such increases in costs and to instead provide a different way for a transliteration of the type initially described.

The invention relates to a method for transliterating code words of a code having m-place code words into the corresponding code words of a different code likewise having m-place code words. With the invention the individual bits of the code word to be transliterated are forwarded in non-negated or negated form, according to the equality (in the following also named coincidence) or non-equality (in the following also named non-coincidence) of the individual bits of the code word to be transliterated of the one code and the corresponding code word of the other code. This occurs during the serial input of the individual bits of the code word to be transliterated into a m-place shift register or during the serial output therefrom, from register stage to register stage, over a respective forwarding circuit. This occurs in such manner that the traversing bits experience a negation before and after a register stage corresponding in position within the shift register to the position of non-coinciding bits within the two code words.

The invention is not restricted to the transliteration of A-law code words into μ-law code words and vice versa, but rather can also be employed in a different transliteration proceeding given a constant bit rate, for example given the inversion of every second bit required in the course of an A-law coding or given a so-called scrambling as well. The invention enables a transliteration given a constant bit rate with a very low circuit expense. This is particularly true when in a further development of the invention shift registers already provided at the beginning or end of a transmission path for buffering and/or for parallel/serial or serial/parallel conversion are augmented with corresponding forwarding circuits. These shift registers augmented by the forwarding circuits are thus co-exploited for the transliteration according to the invention. In devices serially transmitting and receiving messages and which employ one and the same shift register for transmitting and receiving, the forwarding circuits belonging to the shift register stages can thereby likewise be doubly exploited.

BRIEF DESCRIPTION OF THE DRAWINGS

FIG. 1 is a schematic embodiment of a circuit arrangement for transliteration according to the invention; and FIG. 2 shows further circuit details of such a circuit arrangement.

DESCRIPTION OF THE PREFERRED EMBODIMENTS

Illustrated in a scope necessary for an understanding of the invention, FIG. 1 schematically shows a sample embodiment of a circuit arrangement for the transliteration of code words of a code having m-place code words into the corresponding code words of a different code likewise having m-place code words according to the invention. Provided in this circuit arrangement is a m-place shift register comprising register stages RmS, . . ., RjS, RiS, . . ., R1S having one setting input D and a resetting input $\overline{D}$ as well as a complementary output $\overline{Q}$ in addition to an output Q. Forwarding circuits eWm, mWm-1, . . . ,jWi, . . . , 2W1, 1Wa lie in front of and behind the register stages. Depending upon the value of a control bit adjacent to the control input eum of the forwarding circuit eWm, the input e of the shift register is thereby connected to the setting input D or the reset input $\overline{D}$ of the register stage RmS, and the complementary input $\overline{e}$ of the shift register is connected to the reset input $\overline{D}$ or to the setting input D of the register stage RmS. Depending upon the value of the control bits adjacent to the following forwarding circuits . . . ,jWi, . . . , the output of a respectively preceding register stage is connected to the setting input or to the reset input of the respectively following register stage and the complementary output of the respectively preceding register stage is connected to the reset input or to the setting input of the respectively following register stage. Depending upon the value of the control bit adjacent to the control input jui of the forwarding circuit jWi, the output Q of the preceding register stage RjS is connected to the setting input D or to the reset input $\overline{D}$ of the following register stage RiS, and the complementary output $\overline{Q}$ of the register stage RjS is connected to the reset input $\overline{D}$ or to the setting input D of the register stage RiS. Finally, depending upon the value of the control bit adjacent to the control input 1ua of the forwarding circuit 1Wa, the output Q of the register stage R1S is connected to the output a or to the complementary output $\overline{a}$ of the shift register, and the complementary output $\overline{Q}$ of the register stage R1S is connected to the complementary output $\overline{a}$ or to the output a of the shift register.

The negation of bits of a m-bit code word to be transliterated and its actual transliteration occur in such manner that given the serial input of the code word to be transliterated, the respectively traversing bits of the code word are negated before and after the register stage whose position in the shift register corresponds to the position of the corresponding bit in the code word. It is negated by means of switch-over of the corresponding forwarding circuits having corresponding control bits at their control inputs. Every bit to be actually negated thus experiences precisely one negation or an uneven plurality of negations, whereas every bit not to be negated experiences zero or two negations, or an even numbered plurality of negations, and thus remains unaltered in the final result. As soon as the last bit of the code word to be transliterated has been input into the shift register RmS, . . . ,RjS, Ris, . . . , R1S, the transliterated code word now already resides in the shift register instead of the code word to be transliterated. This transliterated code word can then, for example, be output parallel, or given forwarding circuits now free of line crossings and thus not effecting a negation, can be output serially.

Alternatively, it is also possible to input the code word to be transliterated into the shift registers RmS, . . . , RjS, RiS, . . . , R1S in parallel or, given forwarding circuits free of line crossings and thus not effecting any negation, serially and to delay the transliteration until the serial code word output. This is accomplished upon code word output by an appropriate switchover of the forwarding circuits based on the criterion of coincidence or non-coincidence of the individual bits of the code word of the one code to be transliterated and the corresponding code word of the other code, non-negated or negated. The forwarding of the bits is carried out in such manner that the traversing bits experience negation before and after a register stage whose position within the shift register corresponds to the position of non-coinciding bits within the two code words.

As can be seen in greater detail from FIG. 2, the forwarding circuits can be respectively formed by means of a X-circuit having four transistor switches 1, 2, 3, 4 formed by MOS transistors. Two transistor switches are respectively connected to separate input terminals and separate output terminals of the X-circuit and connected with the respective control bit, and the other two transistor switches are connected with the negated control bit. As shown in FIG. 2, the control electrodes of the two transistor switches 1 and 2 connecting through in uncrossed fashion are directly connected to the respective control line carrying the corresponding control bit. The control electrodes of the two transistor switches 3 and 4 respectively connecting through in crossed fashion are connected to the respective control line carrying the corresponding control bit over a NOT element designated NOT.

In the circuit arrangement according to FIG. 2, the control information controlling the transliteration is applied to the parallel control lines in the form of a control byte, whereby the individual control bits are emitted by the individual cells of a control information register Um, . . . ,Uj, Ui . . . , U1. Any desired transliteration of m-place code words of one code into the corresponding m-place code words of a different code can thus be effected by means of entering a corresponding control byte.

Alternatively, although not shown in the drawing, it is also possible to connect one control bit line only either directly or over a negator to the control electrodes of the transistor switches of the individual forwarding circuits in such manner that the desired transliteration ensues when shifting the content of the shift register RmS, . . . ,RjS, RiS, . . . , R1S.

When, as may be seen from FIG. 2, the control information is offered in the form of a control byte in parallel representation, then, as shown in FIG. 2, it is also possible to avoid the expense for double negations between adjacent shift register stages. This is the case since the control line jui carrying the control bit of a forwarding circuit (the forwarding circuit jWi in the example) lying between two register stages (for example, the register stages RjS and RiS) is the output line of an EXCLUSIVE-OR element EXOR. Two inputs of the element EXOR are provided with those two control bits whose positions within the control byte correspond to the positions of the two register stages (RjS and RiS) within the shift register.

When, for example, all bits of each code word with the exception of the first bit are to be negated as would be the case given an A-law/$\mu$-law transliteration, then a control bit "1" is offered by all control information cells Um, . . . ,Uj, Ui . . . (with the exception of the control information cell U1 offering a control bit "0") upon the serial input or output of the code word thereby transliterated into or out of the shift register RmS, . . . ,RjS, RiS, . . . ,R1S. The control bits are linked in pairs in the EXCLUSIVE-OR elements EXOR so that in the forwarding circuits mWm-1, . . . ,jWi, . . . ,2W1 connected to the EXCLUSIVE-OR elements EXOR with their control lines, the transistor switches 3 and 4 effecting a crossed through-connection of only the forwarding circuit 2W1 are driven into their conductive state. On the other hand, the transistor switches 3 and 4 remain in their inhibited state in the remaining forwarding circuits mWm-1, . . . ,jWi, . . . and the transistor switches 1 and 2 effect an uncrossed connection through. Also, the transistor switches 3 and 4 in the forwarding circuit eWm which effect a crossed connection through are driven into their conductive state by means of the control bit "1 " emitted by the control information cell Um. Finally the control bit "0" emitted by the control information cell U1 holds the transistor switches 1 and 2 effecting an uncrossed connection through in the forwarding circuit 1Wa in their conductive state. It thus results that, of all bits of a code word input serially into the shift register RmS, . . . ,RjS, RiS, . . . ,R1S over the input posts e and $\overline{e}$, only the first bit arriving at the shift register stage R1S experiences a two-time negation in the forwarding circuits eWm and 2W1. However, the following bits respectively experience only one negation in the forwarding circuit eWm. After the complete serial input of the code word to be transliterated into the shift register, it is thus precisely the transliterated code word which resides in the shift register. This can then be read out from the shift register either in parallel or, without further negations, serially as well.

Although various minor changes and modifications might be proposed by those skilled in the art, it will be understood that we wish to include within the claims of the patent warranted hereon all such changes and modifications as reasonably come within our contribution to the art.

We claim as our invention:

1. A method for transliterating code words of a code having m-place code words into the corresponding code words of a different code likewise having m-place code words, comprising the steps of:
   forwarding individual bits of the code word to be transliterated in non-negated or negated fashion from register stage to register stage of a m-place shift register over a respective forwarding circuit associated with each register stage;
   said forwarding occurring during serial input of said individual bits into said m-place shift register or during serial output from said m-place shift register;
   said forwarding of said bits in a non-negated or negated fashion depending upon a measure or criterion of equality or non-equality of said individual bits and the bits of the corresponding code word of the different code; and
   during said forwarding said bits respectively experiencing a negation in front of as well as after a register stage when a position of the register stage within the shift register stage corresponds to a position of non-equal bits within the two code words being compared.

2. A circuit arrangement for transliterating code words of a code having m-place code words to the corresponding code words of a different code likewise having m-place code words, comprising:
   a non-feedback shift register formed of a plurality of register stages each having a setting input, a reset input, an output, and a complementary output;
   an input forwarding circuit means connecting an input and complementary input of the shift register to a first following register stage;
   at least one intermediate forwarding circuit means connected between respective register stages;
   an output forwarding circuit means connecting a final register stage with an output and complementary output of the shift register; and
   depending upon a content of control information presented to the input, intermediate, or output forwarding circuit means
   (a) for the input forwarding circuit means, the input of the shift register is connected to the setting input or to the reset input of the first following register stage and/or the complementary input of the shift register is connected to the reset input or to the setting input of the first following register stage;
   (b) for the intermediate forwarding circuit means the output of a respective preceding register stage is connected to the setting input or to the reset input of the respectively following register stage, and/or the complementary output of the respective preceding register stage is connected to the reset input or to the setting input of the respective following register stage;
   (c) and for the output forwarding circuit means the output of a respective preceding register stage is connected to the output or to the complementary outout of the overall shift register, and/or the complementary output of the respective preceding register stage is connected to the output or complementary output of the overall shift register.

3. A circuit arrangement according to claim 2 wherein the forwarding circuit means connects the complementary output of the preceding register stage or the complementary input of the overall shift register respectively to the setting input of at least the rear-most register stage whose position within the shift register corresponds to a position of a last bit of an uninterrupted series of non-equal bits within the two code words; and the forwarding circuit means connecting the output of the preceding register stage or the input of the overall shift register to the reset input of said rear-most register stage and at the same time the output of at least a forward-most register stage whose position within the shift register corresponds to the position of a first bit of an uninterrupted series of non-equal bits within the two code words is connected to the reset input of the following register stage or to the complementary output of the non-fed back shift register, and wherein the forwarding circuit means connects the complementary output of said front-most register stage to the setting input of the following register stage or to the output of the non-feedback shift register.

4. A circuit arrangement according to claim 2 wherein the forwarding circuit means are respectively formed by a X-circuit having four transistor switches in which two transistor switches are respectively connected to separate input posts and separate output posts of the X-circuit and are respectively connected to receive a respective control bit, the other two respective transistor switches being connected to receive a negated control bit.

5. A circuit arrangement according to claim 4 wherein a line carrying a control bit of a forwarding circuit means lying between two register stages is an output line of an EXCLUSIVE-OR element whose two inputs are connected to receive two control bits corresponding in position to positions of the two register stages within the shift register.

* * * * *